United States Patent [19]

Galfo et al.

[11] 4,325,984

[45] Apr. 20, 1982

[54] PLASMA PASSIVATION TECHNIQUE FOR THE PREVENTION OF POST-ETCH CORROSION OF PLASMA-ETCHED ALUMINUM FILMS

[75] Inventors: Christopher H. Galfo, San Jose; Ashok L. Nalamwar, Milpitas, both of Calif.

[73] Assignee: Fairchild Camera & Instrument Corp., Mountain View, Calif.

[21] Appl. No.: 172,745

[22] Filed: Jul. 28, 1980

[51] Int. Cl.³ .......................... B05D 3/04; B05D 3/06
[52] U.S. Cl. ..................................... 427/38; 156/643; 156/646; 156/665; 204/164; 204/192 EC; 204/192 E; 427/309

[58] Field of Search ............... 427/38, 39, 309, 248 R; 204/192 CE, 164, 192 E, 298; 156/643, 646, 665, 656

[56] References Cited

U.S. PATENT DOCUMENTS 4,267,013  5/1981  Iida et al. ...................... 252/79.1 X

*Primary Examiner*—William A. Powell
*Attorney, Agent, or Firm*—Paul J. Winters; Theodore Scott Park; Michael J. Pollock

[57] ABSTRACT

A method for preventing the post-etch corrosion of aluminum or aluminum alloy film which has been etched utilizing chlorinated plasma wherein the etched film is exposed to fluorinated plasma.

9 Claims, No Drawings

PLASMA PASSIVATION TECHNIQUE FOR THE PREVENTION OF POST-ETCH CORROSION OF PLASMA-ETCHED ALUMINUM FILMS

BACKGROUND OF THE INVENTION

1. Field of the Invention

The invention relates to the gaseous plasma etching of aluminum, and particularly to a method for preventing the post-etch corrosion of plasma-etched aluminum film.

2. Description of the Prior Art

According to a typical method for fabricating a semiconductor device, a thin film of aluminum is deposited onto a layer of silicon dioxide formed over a silicon wafer substrate. The aluminum film is masked by photoresist and then etched in a chlorinated plasma to form an electrode or conductor pattern.

Aluminum films etched in this manner suffer a loss in image fidelity due to micro-corrosion of the film which occurs within a short period of time after the film is exposed to air. It is believed that there are two mechanisms by which such micro-corrosion occurs. According to one mechanism, chlorine is absorbed by the photoresist mask during the etching process and forms chlorine compounds. These compounds, when contacted with moist air, release free hydrogen chloride which then attacks the aluminum surfaces exposed by etching.

According to a second and perhaps more damaging mechanism, aluminum chlorides formed in the vacuum of the etching process react with moisture contained in the air to produce hydrogen chloride which attacks the remaining aluminum film.

Micro-corrosion of the aluminum film by the above-described mechanisms results in discontinuities in the conductor pattern and, consequently, has an adverse effect on product yield.

Past attempts to solve the above-described problem have not been completely successful. According to one remedial method, the entire semiconductor wafer is quenched in water immediately following chlorinated plasma etching. The object of the method is to sufficiently dilute the free hydrogen chloride to prevent corrosion. This method is unsatisfactory because only extremely short periods of exposure to air are required for inducing corrosion of the aluminum film. Thus, it is practically impossible to remove the plasma-etched wafer from the vacuum of the etching chamber to a suitable water bath in a time period sufficiently short to prevent corrosion.

According to a second procedure for solving the problem, the photoresist layer is removed from the aluminum film after plasma etching is completed and prior to removal of the wafer from the etching chamber. The object of this method is to remove absorbed chlorine and chlorine compounds and, thus, to prevent the formation of free hydrogen chloride. Not only is this method only a partial solution to the problem since hydrogen chloride continues to be formed through reactions of aluminum chloride, but it also exposes the surface of the aluminum film. Exposure of the aluminum film forecloses utilization of certain subsequent processing steps. For example, wet chemical etching procedures used after plasma-etching could no longer be employed.

According to yet another method, disclosed in U.S. Pat. No. 4,073,669, up to fifteen volume percent ammonia is included with the chlorinated plasma used in the etching process. The ammonia prevents the formation of hydrogen chloride by combining with free chlorine present in the etching atmosphere.

SUMMARY OF THE INVENTION

According to the present invention, chlorinated plasma etching of aluminum film is followed immediately by exposure of the etched aluminum film to a fluorinated passivation plasma before its exposure to air. Exposure of the etched aluminum film to fluorinated plasma prevents postetch corrosion.

Application of this invention to the plasma etching of aluminun and aluminum alloy films has several important advantages over the prior art methods described above. For example, the passivation step can easily be incorporated into the automatic process sequence of the plasma etching equipment and therefore represents no increase in process complexity. Also, by use of fluorinated passivation plasma, the necessity for removing photoresist from the semiconductor device in the plasma etcher is eliminated. This significantly reduces the total wafer processing time. In addition, since the photoresist is not removed, the process allows subsequent desirable or required wet chemical etching to be performed. Furthermore, fluorinated plasma serves the dual purpose of not only passivating the aluminum but also removing silicon which may be left behind from the etching of aluminum-silicon alloys. Yet another advantage is that by eliminating the possibility of post-etch corrosion, no further precautions need be taken after etch to assure image fidelity.

DESCRIPTION OF THE PREFERRED EMBODIMENT

A typical step in the fabrication of semiconductor devices is the formation of a conductor pattern by etching a thin layer of aluminum or aluminum alloy which covers an underlying layer of the semiconductor device. The underlying layer may be silicon dioxide or silicon nitride. The conductor pattern to be etched from the aluminum film is defined by a photoresist masking layer formed over the aluminum film such that only regions unmasked by the photoresist will be etched. For satisfactory results, it is required that etching proceed to the interface between the aluminum layer and the underlying layer without unduly undercutting the aluminum layer. Chlorinated plasma etching provides this result.

In a conventional aluminum etching process, a suitable chlorinated etch gas, such as carbon tetrachloride, is introduced into a reaction chamber which contains the semiconductor device. The reaction chamber is maintained at a desired low pressure by a mechanical vacuum pump which evacuates the chamber. A chlorinated plasma is generated in the reaction chamber by applying RF power to electrodes mounted within the chamber. Power levels of 10 to 500 watts are typical. Etching of the aluminum film by the chlorinated plasma begins when the RF power is applied.

According to the present invention, the reaction chamber is evacuated of chlorinated plasma immediately following the chlorinated plasma-etch of the aluminum film and a fluorinated gas is introduced to the chamber. Suitable RF power levels are applied to generate a fluorinated passivation plasma. Vacuum is not broken between the etch step and exposure of the semiconductor device to the fluorinated passivation plasma.

According to a preferred embodiment of the present invention, the fluorinated gas introduced to the reaction chamber following chlorinated plasma etching is sulfur hexafluoride, $SF_6$. The $SF_6$ is introduced to provide a pressure of about 200 millitor. The reactor chamber is maintained at room temperature, that is, at about 20° C. RF current is about 0.5 amps. Tests have shown that exposure of the aluminum film to the fluorinated plasma for about 1.5 minutes produces satisfactory results. However, this time period is in no way limiting of the invention which may be practiced utilizing exposure times both greater than and less than 1.5 minutes.

EXAMPLE

In a laboratory experiment, four test samples were studied. These samples contained an 8000 A. thick aluminum silicon alloy (1.5% silicon) that had been sputter deposited on a layer of silicon dioxide. Sections of these samples were masked by photoresist 15,000 A. thick. The test pattern consisted of 3.0 micron wide lines. Each of these samples was etched separately in a gas plasma containing carbon tetrachloride, chlorine gas, and nitrogen for a period of time sufficient to remove the nonmasked aluminum-silicon film. The processing steps taken after etch were different for each of the four samples as indicated in Table 1.

TABLE 1

| Case | Steps Taken After Plasma-Etch |
|---|---|
| A | Exposed to air (no post-etch plasma) |
| B | Exposed to fluorinated passivation plasma for 1.5 minutes. |
| C | Exposed to fluorinated passivation plasma for 5.0 minutes. |
| D | Exposed to nitrogen plasma for 5.0 minutes. |

All samples were exposed to air for a period of 20 hours after completion of the above-listed step. Visual observations were then made with the aid of a high-power optical microscope. Samples from cases A and D showed that micro-corrosion had taken place and that the problem had not been solved by post-etch exposure to the nonreactive nitrogen plasma (Case D). Samples from B and C, i.e. the samples exposed to the fluorinated plasma, showed no evidence of micro-corrosion. Subsequent removal of the photoresist from samples B and C indicated that image fidelity of the 3.0 micron wide aluminum silicon lines had been maintained.

We claim:

1. A method for preventing the post-etch corrosion of aluminum or aluminum-alloy film which has been etched utilizing chlorinated plasma comprising exposing the etched film to sulfur hexafluoride plasma.

2. A method for preventing the post-etch corrosion of aluminum or aluminum alloy film which has been etched in a reaction chamber containing chlorinated plasma comprising:
   a. evacuating the reaction chamber of chlorinated plasma;
   b. while maintaining a vacuum in the reaction chamber, introducing fluorinated gas to the chamber;
   c. applying suitable RF power to the chamber to generate a fluorinated plasma for passivation of the etched aluminum film.

3. The method of claim 2 wherein said fluorinated gas includes sulfur hexafluoride.

4. The method of claim 2 wherein said fluorinated gas is sulfur hexafluoride.

5. The method of claim 4 wherein said sulfur hexafluoride is introduced to the reaction chamber to provide a pressure in the chamber of about 200 millitor.

6. The method of claim 5 wherein the reaction chamber is at room temperature.

7. The method of claim 5 wherein the reaction chamber is maintained at about 20° C.

8. The method of claim 6 wherein RF current to the reaction chamber for fluorinated plasma passivation is about 0.5 amps.

9. The method of claim 8 wherein the aluminum film is exposed to sulfur hexafluoride for about 1.5 minutes.

* * * * *

REEXAMINATION CERTIFICATE (1525th)

United States Patent [19]
Galfo et al.

[11] B1 4,325,984
[45] Certificate Issued Aug. 6, 1991

[54] PLASMA PASSIVATION TECHNIQUE FOR THE PREVENTION OF POST-ETCH CORROSION OF PLASMA-ETCHED ALUMINUM FILMS

[75] Inventors: Christopher H. Galfo, San Jose; Ashok L. Nalamwar, Milpitas, both of Calif.

[73] Assignee: Fairchild Semiconductor Corporation, Santa Clara, Calif.

Reexamination Request:
No. 90/002,138, Sep. 17, 1990

Reexamination Certificate for:
Patent No.: 4,325,984
Issued: Apr. 20, 1982
Appl. No.: 172,745
Filed: Jul. 28, 1980

[51] Int. Cl.$^5$ .......................... B05D 3/04; B05D 3/06
[52] U.S. Cl. ..................................... 427/038; 156/643; 156/646; 156/665; 204/164; 204/192.32; 427/309
[58] Field of Search ............ 156/643, 646, 656, 659.1, 156/665; 204/192.1, 192.12, 192.16, 192.3, 192.32, 192.35; 427/38, 39, 309

[56] References Cited

U.S. PATENT DOCUMENTS

| | | | |
|---|---|---|---|
| 3,932,130 | 1/1976 | Bennett et al. | 252/146 X |
| 3,971,684 | 7/1976 | Muto | 252/79.1 X |
| 4,073,669 | 2/1978 | Heinecke | 156/643 |
| 4,162,185 | 7/1979 | Coburn et al. | 156/643 |
| 4,182,646 | 1/1980 | Zajac | 156/643 |
| 4,214,946 | 7/1980 | Forget et al. | 156/643 |
| 4,264,409 | 4/1981 | Forget et al. | 156/643 |
| 4,308,089 | 12/1981 | Iida et al. | 156/643 |

FOREIGN PATENT DOCUMENTS

0010138  4/1980  European Pat. Off.
50-61982  5/1975  Japan.

OTHER PUBLICATIONS

Inoue et al., "Plasma Etching of Aluminum and its Alloy Films", Paper presented to the 17th Symposium of Semiconductor IC's, Nov. 29, 1979 (Tokyo).

T. Y. Fok, "Plasma Etching of Aluminum Films Using $CCl_4$", Spring Meeting, The Electrochemical Society, Inc., Extended Abstracts, vol. 80-1, May 11–16, 1980, pp. 301–303.

G. T. Chin et al., "Plasma Removal of Residue Following Reactive Ion Etching of Aluminum and Aluminum Alloys," IBM Technical Disclosure Bulletin, vol. 21, No. 6, Nov. 1978, p. 2315.

K. Hirobe et al., "Effects of Surface Oxide Films on Aluminum Reactive Sputter Etching", Electrochemical Society, 156 Meeting, Oct. 14–18, 1979 (Los Angeles).

D. L. Flamm, "Measurement and Mechanisms of Etchant Production During the Plasma Oxidation of $CF_4$ and $C_2F_6$", Solid State Technology, Apr. 1979, pp. 109–115.

"Plasma Etching Aluminum-Dry vs. Wet", Circuits Manufacturing (U.S.A.), vol. 18, No. 4, Apr. 1978, pp. 39–42.

J. Bargon et al., "Oxygen-Containing Fluorocarbons as Gaseous Etching Compounds for Reactive-Ion Etching", IBM Technical Disclosure Bulletin, vol. 20, No. 8, Jan. 1978.

*Primary Examiner*—William A. Powell

[57] ABSTRACT

A method for preventing the post-etch corrosion of aluminum or aluminum alloy film which has been etched utilizing chlorinated plasma wherein the etched film is exposed to fluorinated plasma.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-9 is confirmed.

* * * * *

REEXAMINATION CERTIFICATE (3447th)

United States Patent [19]
Galfo et al.

[11] B2 4,325,984
[45] Certificate Issued Mar. 3, 1998

[54] PLASMA PASSIVATION TECHNIQUE FOR THE PREVENTION OF POST-ETCH CORROSION OF PLASMA-ETCHED ALUMINUM FILMS

[75] Inventors: Christopher H. Galfo, San Jose; Ashok L. Nalamwar, Milpitas, both of Calif.

[73] Assignee: Fairchild Camera & Inst., Mountain View, Calif.

Reexamination Requests:
No. 90/003,566, Sep. 13, 1994
No. 90/003,869, Jun. 29, 1995

Reexamination Certificate for:
Patent No.: 4,325,984
Issued: Apr. 20, 1982
Appl. No.: 172,745
Filed: Jul. 28, 1980

Reexamination Certificate B1 4,325,984 issued Aug. 6, 1991

[51] Int. Cl.$^6$ ............................ B05D 3/04; B05D 3/06
[52] U.S. Cl. ....................... 427/38; 156/643; 156/646; 156/665; 204/164; 204/192.32; 427/309
[58] Field of Search ..................... 156/643, 646, 156/665; 427/309, 584; 204/164, 192.32; 216/67, 77

[56] References Cited

U.S. PATENT DOCUMENTS

| | | | |
|---|---|---|---|
| 3,615,956 | 10/1971 | Irving et al. | 156/17 |
| 4,213,818 | 7/1980 | Lemons et al. | 156/643 |
| 4,256,534 | 3/1981 | Levinstein et al. | 156/643 |
| 4,267,013 | 5/1981 | Iida et al. | 156/643 |
| 4,325,984 | 4/1982 | Galfo et al. | 427/38 |
| 4,351,696 | 9/1982 | Radigan et al. | 156/643 |
| B1 4,325,984 | 8/1991 | Galfo et al. | 427/38 |

OTHER PUBLICATIONS

Fok, "Plasma Etching of Aluminum Films Using $CCL_4$", Spring Meeting, The Electrochemical Society, Inc. Extend Abstracts, vol. 80–1, May 11–16, 1980, pp. 301–303.

Inoue et al. article entitled "Plasma Etching of Aluminum and Its Alloy Films", Tokyo, Nov. 29, 1979 English translation of Inoue article.

Poulsen et al. article entitled "Plasma Etching of Aluminum", Dec. 6–8, 1976.

"Programmed Plasma Processing", Richard L. Bersin, presented at the Kodak Microelectronics Seminar, San Diego, CA, Oct. 2, 1978, pp. 1–8.

"DryAl Etching: Etching Aluminum in a Planar Reactor", Dionex Bulletin No. 78/79, 4 pages.

"Fundamentals of Plasma–Etching", Dionex Bulletin No. 70001/79, 8 pages.

"Stripping Wafers with Plasma", Dionex Bulletin No. 73/79, 4 pages.

"De–Scumming Wafers with Plasma", Dionex Bulletin No. 77/79, 1 page.

"Plasma–Etching Polycrystalline Silicon in a Barrel Reactor", Dionex Bulletin No. 72/79, 2 pages.

"DryAl Etching: Etching Aluminum in a Planar Reactor", International Plasma Corporation, Operating Bulletin No. 78, Mar., 1978, 4 pages.

"Plasma–Assisted Etching Techniques for Pattern Delineation", C.M. Melliar–Smith and C.J. Mogab, from *Thin Film Processes*, edited by J.L. Vossen and Werner Kern, Academic Press, 1978, pp. 497–529 and 542–556.

Webster's Ninth New Collegiate Dictionary, p. 429 (1984).

Webster's Third New International Dictionary, p. 786, 1845 (1961).

*Primary Examiner*—William R. Dixon, Jr.

[57] ABSTRACT

A method for preventing the post-etch corrosion of aluminum or aluminum alloy film which has been etched utilizing chlorinated plasma wherein the etched film is exposed to fluorinated plasma.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–9 is confirmed.

* * * * *